(12) United States Patent
Hoshino et al.

(10) Patent No.: US 8,885,683 B2
(45) Date of Patent: Nov. 11, 2014

(54) PROCESS FOR FORMING MICROSTRUCTURE OF NITRIDE SEMICONDUCTOR, SURFACE EMITTING LASER USING TWO-DIMENSIONAL PHOTONIC CRYSTAL AND PRODUCTION PROCESS THEREOF

(75) Inventors: Katsuyuki Hoshino, Tokyo (JP);
Yasuhiro Nagatomo, Kawasaki (JP);
Shoichi Kawashima, Kawasaki (JP);
Takeshi Kawashima, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 178 days.

(21) Appl. No.: 13/606,419

(22) Filed: Sep. 7, 2012

(65) Prior Publication Data
US 2013/0163628 A1 Jun. 27, 2013

Related U.S. Application Data

(60) Provisional application No. 61/578,378, filed on Dec. 21, 2011.

(51) Int. Cl.
*H01S 5/00* (2006.01)

(52) U.S. Cl.
USPC ............... 372/50.124; 372/44.01; 372/43.01

(58) Field of Classification Search
USPC ..................... 372/0.125, 44.01, 43.01
See application file for complete search history.

(56) References Cited

U.S. PATENT DOCUMENTS

| | | | |
|---|---|---|---|
| 7,499,480 B2 | 3/2009 | Nagatomo | 372/50.124 |
| 7,535,946 B2 | 5/2009 | Nagatomo et al. | 372/50.124 |
| 7,796,666 B2 | 9/2010 | Nagatomo | 372/50.124 |
| 7,869,483 B2 | 1/2011 | Uchida et al. | 372/99 |
| 8,130,808 B2 | 3/2012 | Hoshino et al. | 372/50.124 |
| 8,149,892 B2 | 4/2012 | Nagatomo et al. | 372/99 |
| 8,249,126 B2 | 8/2012 | Nagatomo | 372/99 |
| 8,265,114 B2 | 9/2012 | Nagatomo et al. | 372/45.01 |
| 2010/0092800 A1 | 4/2010 | Itagaki et al. | 428/697 |
| 2011/0134956 A1* | 6/2011 | Nagatomo et al. | 372/50.11 |
| 2011/0237077 A1* | 9/2011 | Kawashima et al. | 438/689 |
| 2012/0114006 A1 | 5/2012 | Kawashima et al. | 372/50.12 |
| 2012/0327966 A1* | 12/2012 | Numata | 372/45.01 |

FOREIGN PATENT DOCUMENTS

JP 2004-111766 4/2004

OTHER PUBLICATIONS

H. Matsubara et al., "GaN Photonic-Crystal Surface-Emitting Laser at Blue-Violet Wavelengths", *Science*, vol. 319, pp. 445-447 (Jan. 25, 2008).

* cited by examiner

*Primary Examiner* — Kinam Park
(74) *Attorney, Agent, or Firm* — Fitzpatrick, Cella, Harper & Scinto (57) ABSTRACT

A process for forming a microstructure of a nitride semiconductor including (1) preparing a semiconductor structure which has a second semiconductor layer formed of a group III nitride semiconductor containing at least Al formed on a principal plane of a first semiconductor layer formed of a group III nitride semiconductor containing no Al, and which has a hole that penetrates through the second semiconductor layer and is formed in the first semiconductor layer; (2) subjecting the semiconductor structure to heat treatment under a gas atmosphere including a nitrogen element after step (1) to form a crystal plane of the group III nitride semiconductor containing no Al, on at least a part of a side wall of the hole; and (3) forming a third semiconductor layer formed of a group III nitride semiconductor on the second semiconductor layer after step (2) to cover the upper part of the hole.

16 Claims, 9 Drawing Sheets

PROCESS FOR FORMING MICROSTRUCTURE OF NITRIDE SEMICONDUCTOR, SURFACE EMITTING LASER USING TWO-DIMENSIONAL PHOTONIC CRYSTAL AND PRODUCTION PROCESS THEREOF

CROSS-REFERENCE TO RELATED APPLICATION

This application claims the benefit of U.S. Provisional Application No. 61/578,378, filed Dec. 21, 2011.

BACKGROUND OF THE INVENTION

1. Field of the Invention

The present invention relates to a process for forming a microstructure of a nitride semiconductor, a surface emitting laser using a two-dimensional photonic crystal and a production process thereof.

In particular, the present invention relates to a formation process for forming the microstructure inside the nitride semiconductor, and relates to a technology to be used for a process for producing a light-emitting device and the like using a photonic crystal.

2. Description of the Related Art

As for the surface emitting laser, a surface emitting laser is known which uses a two-dimensional photonic crystal for a reflector.

In a surface emitting laser using a nitride semiconductor that can emit light in a region from near ultraviolet to green, in particular, a distribution Bragg reflector which is generally used is hard to be produced, and accordingly, the surface emitting laser using a two-dimensional photonic crystal has been actively studied.

The photonic crystal has a microstructure in which refractive index is modulated with a period of the wavelength of light or less. Among the photonic crystals, a photonic crystal which functions in a visible region includes a plurality of holes with sizes of the order of several tens to one hundred and several tens nanometers.

When the photonic crystal is structured so as to be embedded inside a semiconductor, an advanced production technology is needed.

On the other hand, other semiconductor layers or electrodes can be laminated with semiconductor layers which sandwich the embedded photonic crystal, and accordingly, the photonic crystal has such an advantage that a photonic-crystal optical device in which an electric current can be injected in a lamination direction can be realized.

Japanese Patent Application Laid-Open No. 2004-111766 discloses a technology for forming holes inside a nitride semiconductor by using a mass transport phenomenon, and also a process for producing a surface emitting laser using the photonic crystal of the nitride semiconductor.

The specific technique is as follows.

Firstly, a hole is formed on the surface of a nitride semiconductor by EB lithography and dry etching.

An $SiO_2$ hard mask is used in the dry etching process.

Next, after the above described hole has been formed, the above described hard mask is removed, and the nitride semiconductor is subjected to heat treatment at 1,000° C. under a gas atmosphere including nitrogen.

As a result, the mass transport of the surface atoms occurs, and eventually, the upper part of the above described hole is covered.

Then, a laser structure containing an active layer is epitaxially grown on the photonic crystal, and the surface emitting laser of the nitride semiconductor is produced.

In addition, a multilayer film of gallium nitride (GaN) and aluminum gallium nitride (AlGaN) in which the mass transport phenomenon is hard to occur as compared to the GaN is used.

Japanese Patent Application Laid-Open No. 2004-111766 adopts a technique for thereby enhancing the accuracy of the position in the depth direction along which the hole is formed.

The optical characteristics of the photonic crystal depend on the size and the shape of the hole.

In order to obtain a photonic crystal device having designed characteristics, the size and the shape of the hole need to be controlled with high accuracy.

In other words, if the size of the hole largely varies in the production process, it is difficult to obtain a photonic crystal having adequate optical characteristics.

A technology of etching a semiconductor in the etching process for forming a hole on the surface of the semiconductor is established, and the size of the hole and the variation within the plane of the hole can be controlled with high accuracy, in this production process.

However, the technique disclosed in Japanese Patent Application Laid-Open No. 2004-111766 has such a problem that after a heat treatment process which follows the etching process of forming the hole on the surface of the semiconductor, the size of the hole becomes larger than that of the hole before the heat treatment process.

In view of the above described problems, an object of the present invention is to provide a process for forming a microstructure of a nitride semiconductor, which can form the microstructure containing holes inside the semiconductor, without largely varying the size of the hole that has been formed by being precisely controlled in an etching process for the semiconductor, even after the semiconductor has been subjected to a heat treatment process; a surface emitting laser using a two-dimensional photonic crystal; and a production process thereof.

SUMMARY OF THE INVENTION

A process for forming a microstructure of a nitride semiconductor of the present invention is the process for forming the microstructure of the nitride semiconductor, which includes (1) preparing a semiconductor structure which has a second semiconductor layer formed of a group III nitride semiconductor containing at least Al formed on a principal plane of a first semiconductor layer formed of a group III nitride semiconductor containing no Al, and which has a hole that penetrates through the second semiconductor layer and is formed in the first semiconductor layer; (2) subjecting the semiconductor structure to heat treatment under a gas atmosphere including a nitrogen element after step (1) to form a crystal plane of the group III nitride semiconductor containing no Al in the first semiconductor layer, on at least a part of a side wall of the hole which has been formed in the first semiconductor layer; (3) forming a third semiconductor layer formed of a group III nitride semiconductor on the second semiconductor layer after step (2) to cover the upper part of the hole.

In addition, the process for producing a surface emitting laser using a two-dimensional photonic crystal of the present invention includes using a photonic crystal that is formed by the above described process for forming the microstructure of the nitride semiconductor.

In addition, the surface emitting laser using a two-dimensional photonic crystal of the present invention is a surface emitting laser using a two-dimensional photonic crystal, which includes an active layer and a photonic crystal structured so that media of a semiconductor layer and a hole having different refractive indexes from each other are arrayed with a two-dimensional period, wherein the semiconductor layer includes a high refractive index semiconductor layer formed of a group III nitride semiconductor containing no Al and a low refractive index semiconductor layer formed of a group III nitride semiconductor containing at least Al, and the high refractive index semiconductor layer is arranged on a side closer to the active layer; and a crystal plane of the high refractive index semiconductor layer is formed on at least a part of a side wall of the hole.

The present invention can realize the process for forming the microstructure of the nitride semiconductor, which can form the microstructure containing holes inside the semiconductor, without largely varying the size of the hole that has been formed by being precisely controlled in the etching process for the semiconductor, even after the semiconductor has been subjected to the heat treatment process; the surface emitting laser using the two-dimensional photonic crystal; and the production process thereof.

Further features of the present invention will become apparent from the following description of examples with reference to the attached drawings.

BRIEF DESCRIPTION OF THE DRAWINGS

FIGS. 4A, 4B and 4C are results obtained by calculating an optical absorption α of a p-type electrode and an optical confinement coefficient Γ of an active layer, using a thickness of a second semiconductor layer as a parameter, in Embodiment 2; FIG. 4B is a result obtained by calculating α; and FIG. 4C is a result obtained by calculating Γ.

DESCRIPTION OF THE EMBODIMENTS

Preferred embodiments of the present invention will now be described in detail in accordance with the accompanying drawings.

Next, a process for forming the microstructure of a nitride semiconductor in embodiments of the present invention will be described below.

Embodiment 1

A process for forming the microstructure of a nitride semiconductor of Embodiment 1 to which the present invention is applied will be described below with reference to FIGS. 1A to 1E.

First Step

Firstly, the first step of preparing a semiconductor structure having a hole will be described below.

Figure 1A:
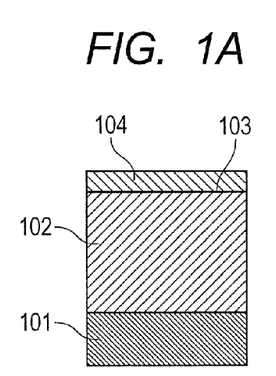
FIGS. 1A, 1B, 1C, 1D and 1E are views for describing a process for forming a microstructure of a nitride semiconductor in Embodiment 1.

As is illustrated in FIG. 1A, a first semiconductor layer 102 formed of a group III nitride semiconductor containing no Al is laminated on a substrate 101.

Subsequently, a second semiconductor layer 104 formed of a group III nitride semiconductor containing at least Al is laminated on a principal plane 103 of the first semiconductor layer 102.

The substrate 101 can be a hexagonal crystal, for instance, and more specifically can be made from any one of GaN, sapphire and SiC.

In addition, the first semiconductor layer 102 is a nitride semiconductor of any one of GaN, GaInN and InN, for instance.

In addition, the second semiconductor layer 104 is a nitride semiconductor of any one of AlN, AlInN, AlGaInN and AlGaN, for instance.

Incidentally, in the present embodiment, the substrate 101 is formed of a GaN substrate, the first semiconductor layer 102 is formed of GaN, and the second semiconductor layer 104 is formed of AlGaN.

The first semiconductor layer 102 and the second semiconductor layer 104 are grown, for instance, by a metal-organic vapor phase epitaxial (MOVPE) method. Incidentally, in the present embodiment, the principal plane 103 of the first semiconductor layer 102 is a (0001) plane.

Next, a process of forming an etching mask for forming the hole will be described below.

Figure 1B:
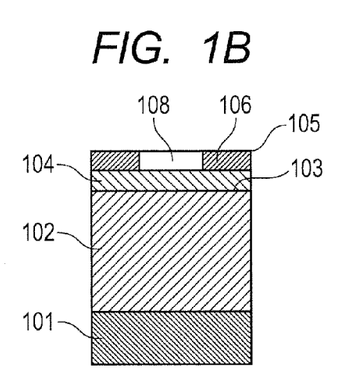

FIG. 1B is a view for describing the process of forming the etching mask 106 for forming the hole 107 on a principal plane 105 of a second semiconductor layer 104, which follows the process of FIG. 1A.

The process of FIG. 1B will be sequentially described below.

A material of the etching mask 106 is deposited on the principal plane 105 of the second semiconductor layer 104 by plasma CVD (Chemical Vapor Deposition).

The material of the etching mask 106 can be any one of, for instance, silicon oxide, silicon nitride and silicon oxynitride which are easily processed.

Incidentally, in the present embodiment, the silicon oxide is used as the material of the etching mask 106.

In addition, the deposition technique for the etching mask may be sputtering or electron beam evaporation.

Subsequently, an opening 108 is formed in the etching mask 106. The opening 108 is formed by using photolithography and etching.

The lithography may be one of electron-beam lithography and nanoimprint lithography.

The etching for the opening 108 may be any one of wet etching and dry etching, but can be the dry etching by ICP (Inductively Coupled Plasma), in order to enhance the controllability for the size of the opening 108.

Incidentally, the opening 108 in the present embodiment has a round shape with a diameter of 1 μm.

Next, a process of forming the hole will be described below.

Figure 1C:
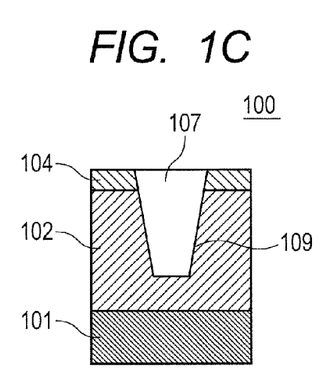

FIG. 1C is a view for describing a process of etching the first semiconductor layer 102 by penetrating through a second semiconductor layer 104 to form the hole 107, which follows the process of FIG. 1B.

The process of forming the hole 107 may also be any one of wet etching and dry etching, but can be the dry etching by ICP, in order to enhance the controllability for the size of the hole 107.

The composition of the plasma used for the dry etching process for forming the hole 107 includes, for instance, any one element of Cl, Br and I.

More specifically, the composition of the plasma can be a mixed gas of any one gas of $Cl_2$, $BCl_3$, HBr, HI and HCl and any one gas of He, Ar, Xe and $N_2$. The etching mask 106 is removed after the process of forming the hole 107.

Through the processes from FIG. 1A to FIG. 1C, the semiconductor structure 100 can be prepared which has the second semiconductor layer 104 provided on the principal plane 103 of the first semiconductor layer 102, and has the hole 107 that penetrates through the second semiconductor layer 104 and is formed in the first semiconductor layer 102.

Incidentally, the hole 107 in the present embodiment has a round shape with a diameter of 1 μm in the upper part thereof, and is formed so as to have a depth of 2.5 μm.

Second Step

Figure 1D:
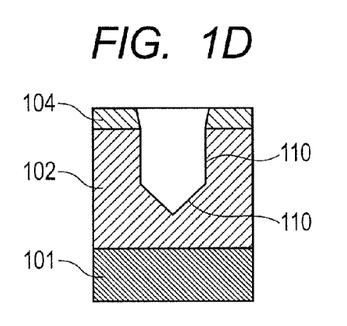

Next, a second step which is a heat treatment process illustrated in FIG. 1D will be described below. FIG. 1D is a view for describing the second step of subjecting the semiconductor structure 100 to heat treatment under a gas atmosphere including nitrogen that is an element of the group V, which follows the process of FIG. 1C.

In the process of FIG. 1D, mass transport is caused on a side wall 109 in the region of the first semiconductor layer 102 of the hole 107, and a crystal plane 110 of the nitride semiconductor constituting the first semiconductor layer 102 is formed on at least a part of the side wall 109.

The mass transport is such a phenomenon that an atom is desorbed from the surface by thermal energy, is transported, and then adsorbs again onto a surface in a position at which the surface energy becomes small. This phenomenon can change the shape of the surface and form the crystal plane, while keeping the composition of the semiconductor.

Next, the gas atmosphere in the second step which is the heat treatment process will be described below.

The second step is conducted under a gas atmosphere including nitrogen which is an element of the group V, for instance, under a gas atmosphere including $N_2$ or $NH_3$.

The reason why the heat treatment is conducted under the gas atmosphere of the group V is because an element of the group V is more easily desorbed than an element of the group III, and the heat treatment to be conducted under the gas atmosphere to which the element of the group V is supplied prevents the element of the group V from desorbing in the first semiconductor layer 102.

Next, the formation of the crystal plane by the second step will be described below.

In the present embodiment, the principal plane 103 of the first semiconductor layer 102 is a (0001) plane, and accordingly any one plane of the following (1-10n (where n is an integer from 0 to 4)) planes is formed on the side wall 109 formed after the second step.

In other words, a crystal plane 110 which is equivalent to a (1-100) plane perpendicular to the principal plane 103 is formed on the side wall 109 formed after the second step.

Alternatively, a crystal plane 110 is formed which is equivalent to any one of a (1-101) plane inclined at approximately 62 degrees, a (1-102) plane inclined at approximately 43 degrees, a (1-103) plane inclined at approximately 32 degrees and a (1-104) plane inclined at approximately 25 degrees.

When the principal plane 103 of the first semiconductor layer 102 is the (1-100) plane, the crystal plane 110 equivalent to the (0001) plane is formed on the side wall 109.

Alternatively, any one plane out of the following (1-10n (where n is an integer from 1 to 4)) planes is formed.

Specifically, a crystal plane 110 is formed which is equivalent to any one of the (1-101) plane, the (1-102) plane, the (1-103) plane and the (1-104) plane.

In addition, in the second step, the crystal plane 110 is formed, which means that the second step has a function of improving the crystallinity of the surface of the hole 107.

When the hole 107 is formed by dry etching, for instance, a large number of defects on an atom level are generated on the surface of the hole 107 by the impact of ions in plasma.

However, when the crystal plane 110 is formed by the mass transport, the atoms are arranged again so that the defects are repaired, and as a result, the surface having better crystallinity than that before the heat treatment is conducted is obtained.

In addition, if the crystal plane 110 perpendicular to the principal plane 103 is formed by the mass transport in the second step, the crystal plane 110 can be used also for shaping the hole 107 which has been formed by dry etching.

In other words, in the dry etching, the ion-drawing voltage of plasma is lowered to sacrifice the perpendicularity of the side wall 109, and thus the generation of the defect due to the impact of the ions is suppressed.

Next, in the second step the perpendicularity of the side wall 109 is developed, and simultaneously restores the defect on the surface is repaired. As a result, perpendicularity of the hole 107 and the crystallinity of the side wall 109 can be in a better condition than that right after the dry etching.

Next, a function of the second semiconductor layer in the second step, which is formed of a group III nitride semiconductor containing at least Al, will be described below.

In the second step illustrated in FIG. 1D, the principal plane 103 of the first semiconductor layer 102 except the hole 107 is covered with the second semiconductor layer 104.

Here, as is disclosed in Japanese Patent Application Laid-Open No. 2004-111766, it is difficult for AlGaN compared to GaN to cause a mass transport phenomenon.

Because of this, the second semiconductor layer 104 suppresses a large variation of the size of the hole 107, which may be generated by excessive mass transport in the first semiconductor layer 102.

In other words, if the principal plane 103 of the first semiconductor layer 102 except the hole 107 is not covered with the second semiconductor layer 104, the atoms which have been desorbed from the surface of the first semiconductor layer 102 enter into the hole 107 and then adsorb onto the side wall 109. As a result, the hole size or the depth of the hole 107 becomes small.

In the present embodiment, the hole size (distance between opposing side wall surfaces) of the hole 107 formed after the second step did not almost change and was approximately 1 μm, with respect to the diameter of 1 μm of the opening 108.

Third Step

Next, a third step of covering the upper part of the hole will be described below.

Figure 1E:
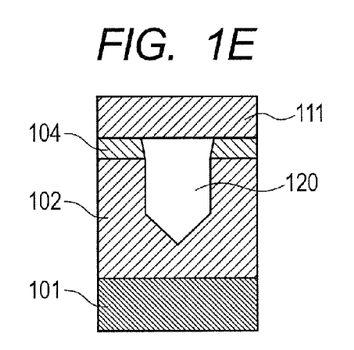

FIG. 1E is a view for describing the third step of covering the upper part of the hole 107, which follows the process of FIG. 1D.

Following the second step, a third semiconductor layer 111 formed of a group III nitride semiconductor is formed by crystal growth on the second semiconductor layer 104 so as to cover the upper part of the hole 107.

The third semiconductor layer 111 is formed of any one nitride semiconductor of GaN, GaInN, InN, AlN, AlGaN, AlInN and AlGaInN, for instance. Incidentally, in the present embodiment, the third semiconductor layer 111 is formed of GaN.

Next, an effect of the crystal plane in the third step, which has been formed in the second step, will be described below.

In this third step, the crystal plane 110 effectively functions which has been formed on the side wall 109 in the second step.

In other words, because the crystal plane 110 is formed on the side wall 109, the rate of crystal growth can be controlled.

When the crystal plane 110 which has been formed on the side wall 109 is in a state of a (1-100) plane, and crystals have been grown in the third step under such a condition that the growth rate on the (1-100) plane is slower than that on the (0001) plane or the (1-101) plane, the hole can be covered in the following way.

Namely, the upper part of the hole 107 can be covered with the third semiconductor layer 111, while the hole size (distance between opposing side wall surfaces) of the hole 107 is not largely varied.

In addition, when the crystal plane 110 which has been formed on the side wall 109 is in a state of the (1-101) plane, for instance, and crystals have been grown in the third step under such a condition that the growth on the (1-101) plane is slower than that on the (0001) plane and the (1-100) plane, the hole can be covered in the following way.

In other words, the upper part of the hole 107 can be covered with the third semiconductor layer 111, while the depth of the hole 107 is not largely varied.

Incidentally, in the present embodiment, the diameter of the upper part of the hole 107 is 1 µm, but in order that the upper part of the hole 107 is covered, the depth of the hole 107 can be such a depth that an aspect ratio is 2 or more.

In addition, when the diameter of the upper part of the hole 107 is 1 µm or less, for instance, 300 nm or less, the upper part of the hole 107 can be covered even when the depth of the hole 107 is so small that the aspect ratio is 2 or less.

In addition, in order that the variation of the hole size (distance between opposing side wall surfaces) of the hole 107 before and after the third step becomes small, the diameter of the upper part of the hole 107 before the third step can be 150 nm or less. The growth rate is controlled by mainly optimizing growth temperature. In the present embodiment, in particular, the first semiconductor layer 102 and the third semiconductor layer 111 have the same composition, and accordingly, the temperature can be arbitrarily optimized.

By successively going through the processes of FIGS. 1A to 1E, a hole 120 having its size precisely controlled can be formed inside the nitride semiconductor.

Here, a process for covering the upper part of the hole in the present embodiment is different from that in Japanese Patent Application Laid-Open No. 2004-111766.

In Japanese Patent Application Laid-Open No. 2004-111766, the mass transport of a GaN layer which has been formed in the lower part of an AlGaN layer is greatly promoted only by one heat treatment process, and mass transfer from the GaN layer to the AlGaN layer is generated to cover the upper part of the hole.

In other words, a large amount of GaN which forms the side wall of the above described hole of the above described GaN layer transfers to the above described AlGaN layer, and accordingly the size of the hole increases.

In contrast to this, in the present embodiment, the mass transport is used for forming a crystal plane in at least a part of the side wall of the hole in the second step, and the process of covering the upper part of the hole is conducted by the crystal growth of the third semiconductor layer in the third step.

Thereby, in the present embodiment, the size of the hole does not largely change because the mass transport is used only for forming the crystal plane on at least a part of the side wall surfaces of the hole, while in Japanese Patent Application Laid-Open No. 2004-111766, the size of the hole greatly increases due to remarkable mass transport. In other words, when compared to Japanese Patent Application Laid-Open No. 2004-111766, the present embodiment enables the hole to be formed inside the semiconductor layer while almost maintaining the size of the hole which has been formed by etching.

Next, the shape of the hole formed after the second step will be described below.

When the principal plane 103 of the first semiconductor layer 102 is the (0001) plane, the hole 107 to be formed after the second step is a polyhedron containing any one of crystal planes 110 which are equivalent to the following planes.

Specifically, the hole 107 is the polyhedron containing any one of the crystal planes 110 which are equivalent to a (1-100) plane, a (1-101) plane, a (1-102) plane, a (1-103) plane or a (1-104) plane.

Figure 2A:
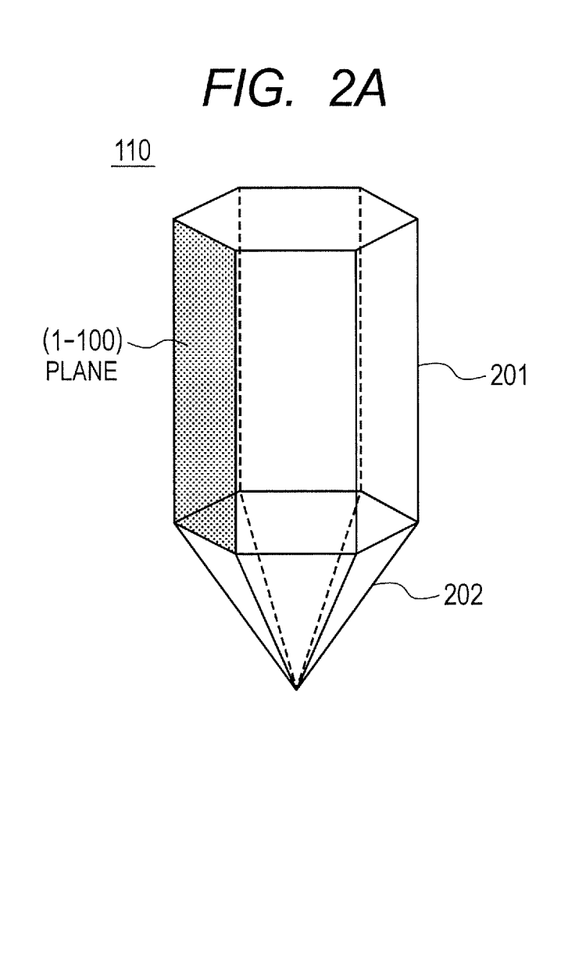
FIGS. 2A and 2B are perspective views of a hole which has been formed by a formation process in Embodiment 1.
Figure 2B:
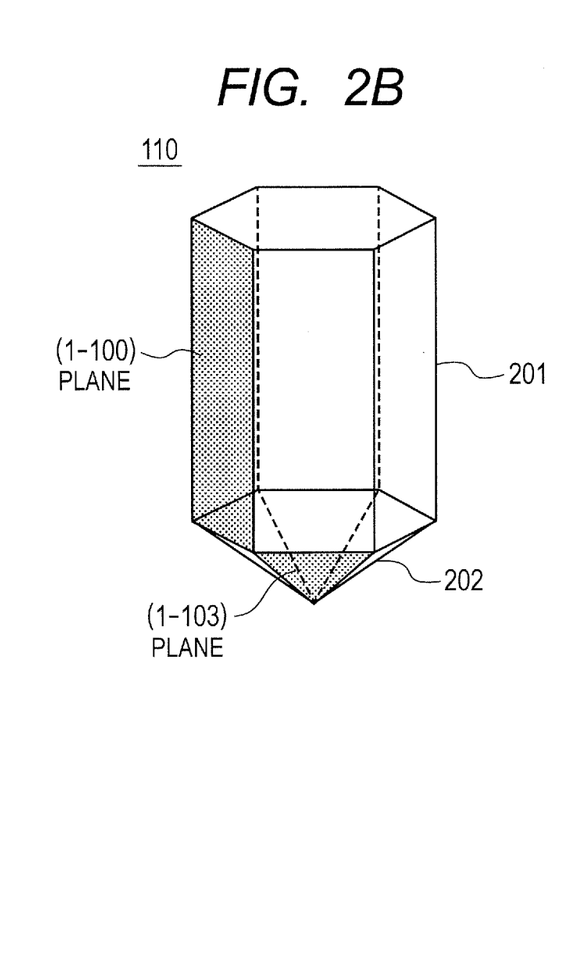

For instance, FIGS. 2A and 2B are views for describing an example of the hole 107 which has been formed after the second step.

In FIG. 2A, the hole 107 has a structure in which the lower end of a hexagonal column 201 having six crystal planes 110 which are equivalent to the (1-100) plane is connected to a six-sided pyramid 202 containing the six crystal planes 110 which are equivalent to the (1-101) plane.

When the depth of the hole 107 is shallow, the hexagonal column 201 does not exist and has a structure in which the six-sided pyramid 202 is directly connected.

In addition, each vertex constituting the hole 107 does not necessarily form an acute angle, but occasionally forms a round shape as well in which the corner has been lost.

In addition, the six-sided pyramid 202 can also be controlled to form a polyhedron which contains any one of the crystal planes 110 that are equivalent to the (1-102) plane, the (1-103) plane or the (1-104) plane, by adjusting the temperature and the gas atmosphere in the second step.

For instance, the hole 107 having the shape illustrated in FIG. 2B is formed depending on the condition after the second step. In FIG. 2B, the six-sided pyramid 202 containing the six crystal planes which are equivalent to the (1-103) plane is formed in the lower side (substrate side) of the hexagonal column 201.

Embodiment 2

In Embodiment 2, an example of the formation process of a photonic crystal will be described below which is structured by using the processes in Embodiment 1 so that the plurality of the above described holes are arrayed.

In the present embodiment, the first semiconductor layer 102 is made of GaN, the second semiconductor layer 104 is made of AlGaN, and the third semiconductor layer 111 for covering the upper part of the hole 107 is made of GaN.

In addition, a principal plane 103 of the first semiconductor layer 102 is a (0001) plane.

The first semiconductor layer 102 may be made of any one of GaInN and InN, and the third semiconductor layer 111 may be made of any one of AlN, AlGaN, GaInN, InN, AlInN and AlGaInN.

Next, a process of forming an etching mask will be described below.

Figure 3A:
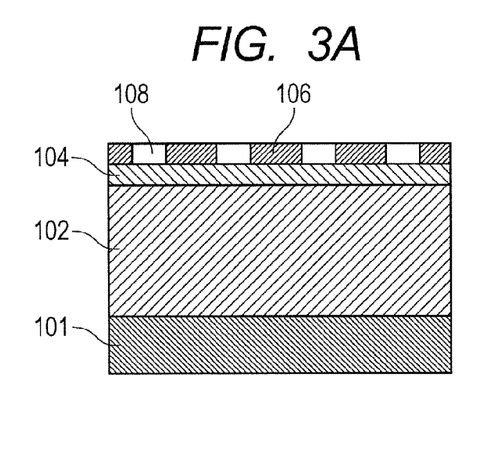
FIGS. 3A, 3B, 3C and 3D are cross-sectional views for describing an example of formation processes in Embodiment 2.

In order to form the photonic crystal, as is illustrated in FIG. 3A, a plurality of openings 108 are periodically formed in the process of patterning the opening 108 of an etching mask 106. In the present embodiment, the circular openings

108 having a diameter of 120 nm are patterned in the plane of the etching mask 106 so as to form a tetragonal lattice shape with a period of 300 nm.

Next, a process of forming the hole will be conducted.

Figure 3B:
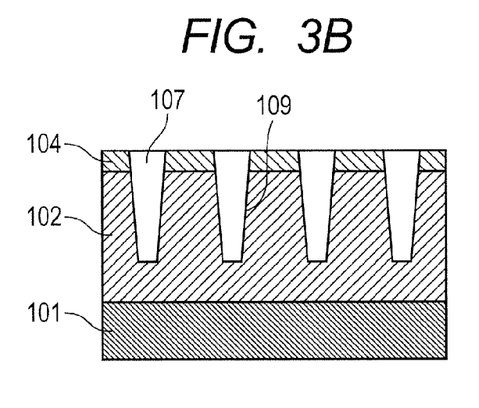

Here, as is illustrated in FIG. 3B, the plurality of the holes 107 which form lattice points of the photonic crystal are formed in the first semiconductor layer 102 by penetrating through the second semiconductor layer 104, by the dry etching which follows the process of FIG. 3A.

Subsequently, the etching mask 106 is removed.

Next, the second step is conducted.

Figure 3C:
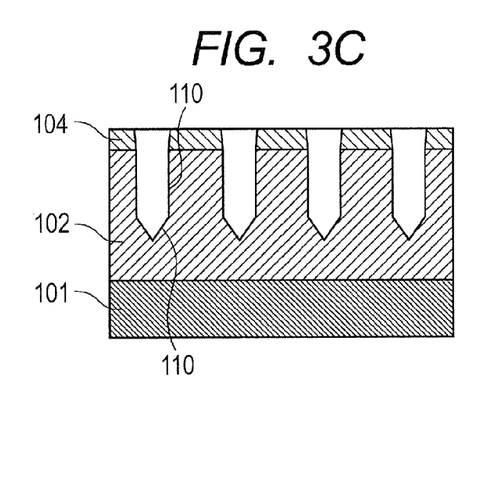

Specifically, as is illustrated in FIG. 3C, the second step of heat treatment is performed with a second semiconductor layer 104 as a mask for suppressing mass transport is subjected to.

As a result, a (1-100) plane perpendicular to a principal plane 103 of the first semiconductor layer 102, which is a (0001) plane, is formed on the side wall 109 of the hole 107 that forms a photonic crystal, by mass transport, while the hole size (distance between opposing side wall surfaces) or the hole depth of the hole 107 before and after the heat treatment is not largely varied.

Figure 3D:
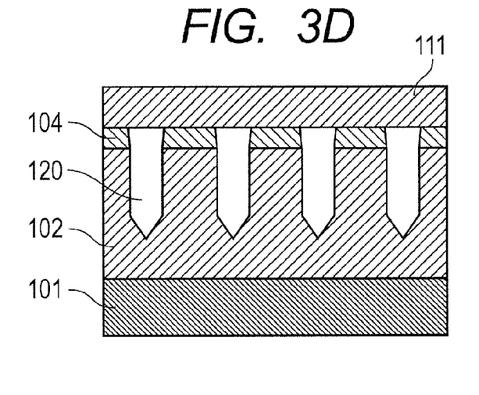

Next, the third step is conducted, as is illustrated in FIG. 3D.

In other words, the third semiconductor layer 111 is formed by crystal growth on the second semiconductor layer 104 so as to cover the upper part of the hole 107.

As a result, a hole 120 can be formed inside the first semiconductor layer 102 and the second semiconductor layer 104, without largely varying the hole size (distance between opposing side wall surfaces) or the hole depth of the hole 107 which has been formed by etching.

In the present embodiment, the hole size (distance between opposing side wall surfaces) formed after the third step was approximately 105 nm. The reason why the variation of the size of the hole is reduced to 15 nm is due to the effect of having formed the crystal plane 110 in the second step.

In the case of the photonic crystal, in particular, the size of the hole 107 (vacancy 120) is an important parameter for determining the diffraction efficiency, and it is a necessary condition for forming the photonic crystal as designed with high accuracy not to largely vary the size of the hole 107 in the production process.

Here, an influence of the present embodiment to be given on optical characteristics of the surface emitting laser will be described below, as to the case where a surface emitting laser is produced according to a process for producing the surface emitting laser using a two-dimensional photonic crystal by using the process in the present embodiment.

When a surface emitting laser using a two-dimensional photonic crystal is produced using the process in the present embodiment, the two-dimensional photonic crystal is structured so that media of a semiconductor layer and a hole having different refractive indices from each other are arrayed with a two-dimensional period.

Here, the above described semiconductor layer has a laminated structure of a high refractive index semiconductor formed of a group III nitride semiconductor containing no Al and a low refractive index semiconductor formed of a group III nitride semiconductor containing at least Al.

In addition, when the above described two-dimensional photonic crystal is formed on an active layer, the low refractive index semiconductor which is formed of the group III nitride semiconductor containing Al and functions as a mask for suppressing mass transport is formed on a side farther from the active layer.

Figure 4A:
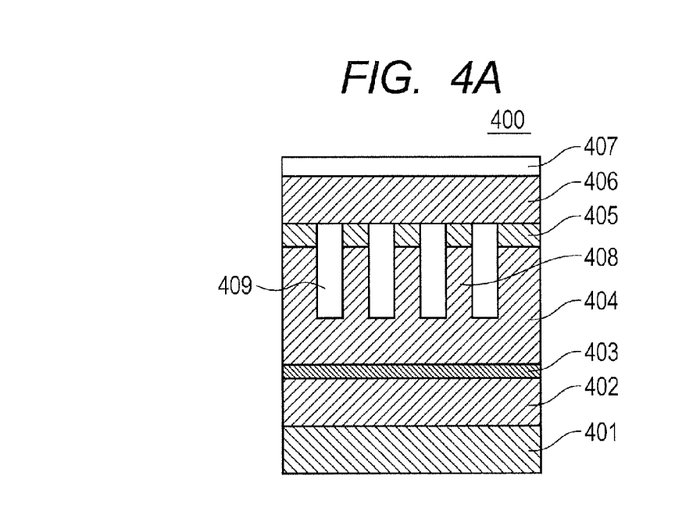
FIG. 4A is a schematic view of a structure used for calculation.

FIG. 4A illustrates a schematic view of a structure used for a calculation about an optical absorption coefficient α of a p-type electrode and an optical confinement coefficient Γ of an active layer in a surface emitting laser using a two-dimensional photonic crystal to which the present embodiment has been applied.

In order to confirm the influence of the present embodiment on the optical characteristics of the surface emitting laser based on the structure illustrated in FIG. 4A, the optical absorption coefficient α of an electrode 407 and the optical confinement coefficient Γ of an active layer 403 in a surface emitting laser 400 were calculated.

In this calculation, the thickness of a lower optical guide layer 402 was set at 100 nm, and the thickness of the active layer 403 was set at 22.5 nm.

In addition, the total thickness of an upper optical guide layer 404 containing a part of a two-dimensional photonic crystal 408 which corresponded to the first semiconductor layer of Embodiment 1, and a semiconductor layer 405 which corresponded to a second semiconductor layer and functioned as a mask for suppressing mass transport was set at 300 nm.

In addition, the thickness of the upper optical guide layer 406 which corresponded to the third semiconductor layer positioned in the upper part of the hole 409 was set at 100 nm, the thickness of the p-type electrode 407 was set at 50 nm, and the thickness of the lower cladding layer 401 was set to be infinite.

Incidentally, the distance from the active layer 403 to the bottom of the hole 409 forming the two-dimensional photonic crystal 408 was set at 100 nm.

In addition, the above coefficients were calculated by setting the refractive indices of the lower cladding layer 401 and the second semiconductor layer 405 functioning as a mask for suppressing mass transport at 2.48 that corresponds to the refractive index of AlGaN having an Al composition of 10%.

In addition, the above coefficients were calculated by setting the refractive indices of the lower optical guide layer 402, the upper optical guide layer 404 containing a part of the two-dimensional photonic crystal 408 and the upper optical guide layer 406 which was positioned in the upper part of the vacancy forming the two-dimensional photonic crystal 408, at 2.55 which corresponds to the refractive index of GaN.

In addition, the above coefficients were calculated by setting the refractive index of the active layer 403 at 2.62, setting the refractive index of the lower part of 10 nm of the p-type electrode 407 having a thickness of 50 nm at 1.61, and setting the refractive index of the upper part of 40 nm of the p-type electrode 407 at 1.66.

In addition, the above coefficients were calculated by setting the lattice constant of the two-dimensional photonic crystal 408 having a tetragonal lattice at 160 nm, setting the diameter of the columnar hole forming the two-dimensional photonic crystal 408 at 64 nm, and setting the depth of the columnar hole at 200 nm.

Furthermore, the above coefficients were calculated by setting the emission wavelength at 400 nm.

Figure 4B:
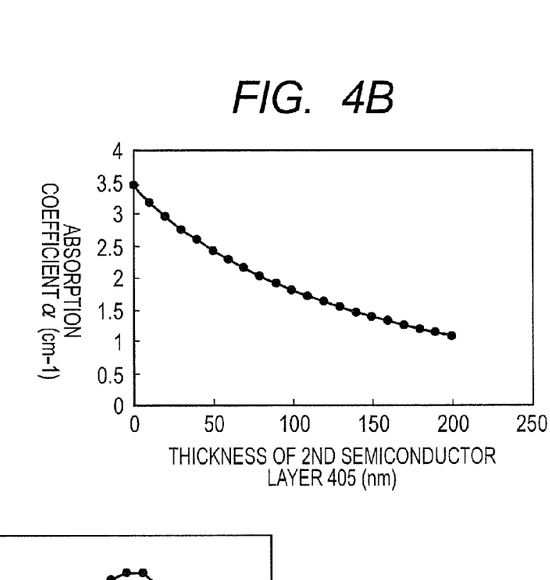

FIG. 4B illustrates a result obtained by calculating the optical absorption coefficient α in the p-type electrode 407 with respect to the thickness d of the semiconductor layer 405 which corresponds to the second semiconductor layer and functions as a mask for suppressing mass transport.

In FIG. 4B, α decreases with the increase of d.

This is because the average refractive index of the two-dimensional photonic crystal 408 decreases due to the increase of the thickness d of the second semiconductor layer 405 having a low refractive index to suppress the introduction of light into the p-type electrode 407.

Figure 4C:
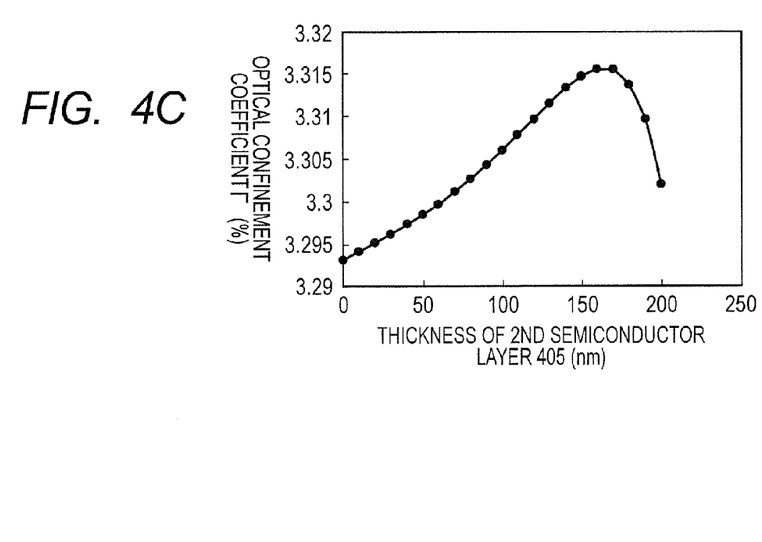

In addition, FIG. 4C illustrates a result obtained by calculating the optical confinement coefficient Γ of the active layer 403 with respect to the thickness d of the semiconductor layer 405 which corresponds to the second semiconductor layer and functions as the mask for suppressing mass transport.

When d is 160 nm or less, Γ monotonically increases with the increase of d.

However, when d exceeds 160 nm, Γ changes from the monotonical increase to monotonical decrease.

The reason why Γ monotonically increases until d reaches 160 nm is because the average refractive index of the two-dimensional photonic crystal 408 decreases similarly to the case of the above described α and thereby the spread of light toward the upper part of the two-dimensional photonic crystal 408 is suppressed. Accordingly, the optical confinement in the active layer 403 increases more for that.

On the other hand, when d exceeds 160 nm, the average refractive index of the two-dimensional photonic crystal 408 excessively decreases, the peak of the distribution of light results in being shifted to be at a position lower side than the active layer 403 to decreases the optical confinement to the active layer 403.

Accordingly, the film thickness of the second semiconductor layer is favorably 160 nm or less.

As described above, when the surface emitting laser using the two-dimensional photonic crystal is produced by using the process of the present embodiment, the optical absorption in the p-type electrode can be suppressed, the optical confinement to the active layer can be increased, and accordingly the optical characteristics of the surface emitting laser can be improved.

Embodiment 3

In Embodiment 3, the case where the hole is formed by using an etching mask having at least such one side of the top surface shape of an opening of the etching mask 106 as to be parallel to the crystal plane 110 of the first semiconductor layer 102 will be described below.

In the second step of the present invention, the crystal plane 110 of the first semiconductor layer 102 is formed on the side wall 109 of the hole 107 by mass transport.

In the present embodiment, the principal plane 103 of the first semiconductor layer 102 is a (0001) plane, and accordingly a (1-100) plane perpendicular to the principal plane 103 is formed on the side wall 109, in the second step.

Figure 5A:
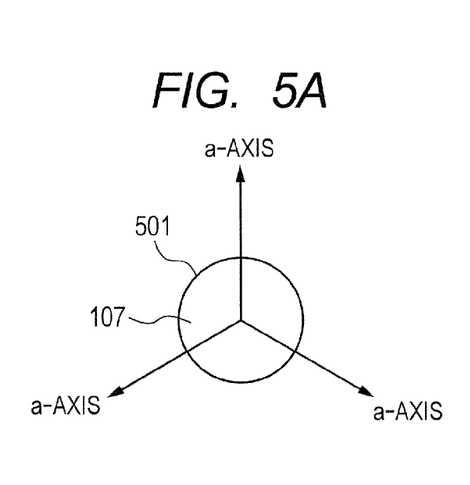
FIGS. 5A, 5B, 5C and 5D are cross-sectional views for describing a modified example of formation processes in Embodiment 3.
Figure 5B:
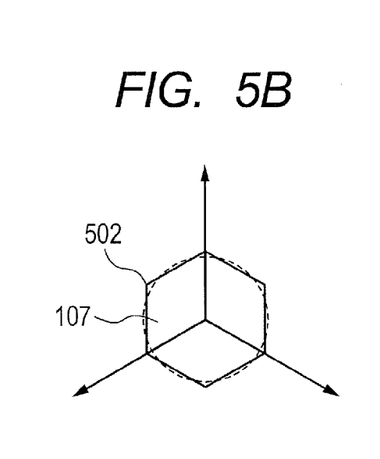

Specifically, even when the top surface shape of the hole 107 is a circle 501 before the second step as is illustrated in FIG. 5A, the top surface shape thereof is deformed to be a hexagon 502 after the first heat treatment process, as is illustrated in FIG. 5B.

The hole size (distance between opposing side wall surfaces) of the hole 107 varies to no small extent when the top surface shape is deformed from the circle 501 into the hexagon 502.

In FIG. 5B, the dotted line shows the size of the original circle 501.

Then, in the present embodiment, in order to suppress the variation before and after the heat treatment as much as possible, the hole 107 having the top surface shape which has been formed to be the hexagon is prepared in a stage prior to the second step.

The process will be described below.

The top surface shape of the hole 107 before the second step is formed in such a way that the shape of the opening 108 of the etching mask 106 is transferred.

Thus, the, the opening 108 may also be patterned so that the top surface shape of the opening 108 has a side parallel to the crystal plane 110 of the first semiconductor layer 102, in the process of patterning of the opening 108.

In the present embodiment, the principal plane 103 is the (0001) plane, and accordingly patterning of a regular hexagon 503 is conducted which has the sides parallel to the plane equivalent to the (1-100) plane.

For information, the side parallel to the plane equivalent to the (1-100) plane means a side parallel to any one of a [1-100] direction, a [10-10] direction, a [01-10] direction, a [-1100] direction, a [-1010] direction and a [0-110] direction.

The sides constituting the regular hexagon 503 may not be completely parallel to the crystal plane 110 of the first semiconductor layer 102, but a deviation of ±10° is permitted.

And besides, the vertexes of the regular hexagon 503 to be provided by the patterning can be formed so as to be positioned on a crystal axis (a-axis) of the first semiconductor layer 102.

In addition, each vertex of the regular hexagon 503 does not necessarily form an acute angle.

Figure 5C:
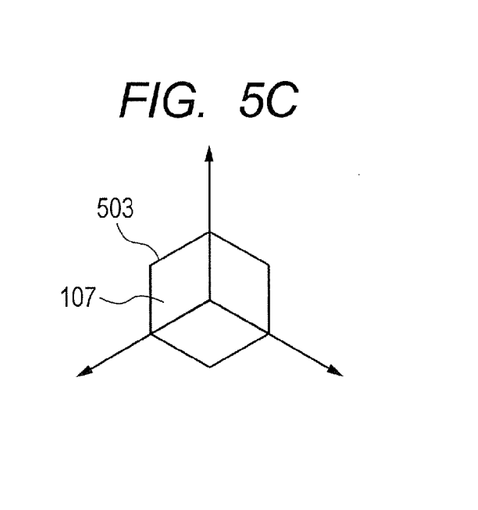

The thus formed hole 107 is the regular hexagon 503 which is formed by planes parallel to the crystal plane 110 of the first semiconductor layer 102 as is illustrated in FIG. 5C, before the second step.

Figure 5D:
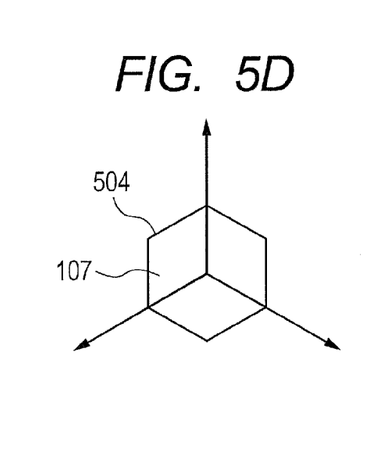

The top surface shape of the hole 107 becomes a hexagon 504 as is illustrated in FIG. 5D, even after the second step, and the shape and the size thereof do not almost change.

The formation process of the present embodiment is an effective process which can form the hole 120 inside the semiconductor without varying the hole size (distance between opposing side wall surfaces) of the hole 107 formed after the etching process, as little as possible.

In the present embodiment, the case where the principal plane 103 of the first semiconductor layer 102 is the (0001) plane has been described, but in the case where the principal plane 103 is the (1-100) plane, the opening 108 may be formed to be a quadrangle.

Specifically, the quadrangle is a quadrangle having sides parallel to the (0001) plane and a plane equivalent to the (10-10) plane.

The side parallel to the (0001) plane and the plane equivalent to the (10-10) plane means a side parallel to any one of the <0001> direction and the <10-10> direction.

Embodiment 4

In the present embodiment, the case in which the hole 107 is formed not by etching but by crystal growth in the first step will be described below.

The process will be described below.

Firstly, the first semiconductor layer 102 is formed so as to have a thickness which corresponds to the height up to the bottom face of the hole 107.

Figure 6A:
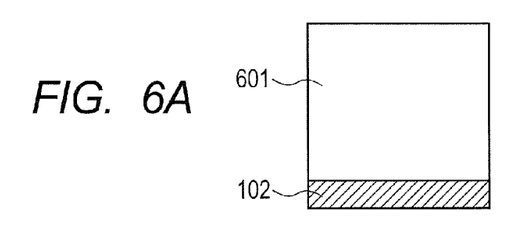
FIGS. 6A, 6B, 6C, 6D and 6E are cross-sectional views for describing an example of the formation process of the first step in Embodiment 4.

Next, as is illustrated in FIG. 6A, a crystal growth suppressing mask 601 which is made of silicon oxide, for instance, is deposited on the above described first semiconductor layer 102 so as to have a thickness exceeding the height of the hole 120 by using, for instance, an electron beam deposition apparatus, a sputtering apparatus or the like.

Figure 6B:
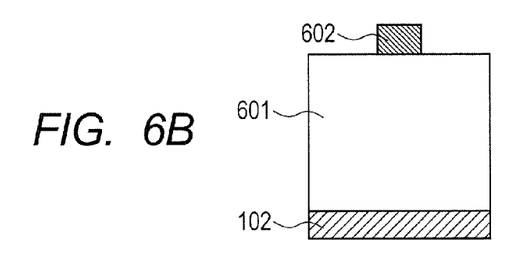

Then, as is illustrated in FIG. 6B, after the mask 601 has been deposited, a resist 602 is formed on a position where the hole 107 is formed on the crystal growth suppressing mask 601 by electron beam exposure.

Subsequently, the crystal growth suppressing mask 601 is dry-etched by using the resist 602 as a mask.

Figure 6C:
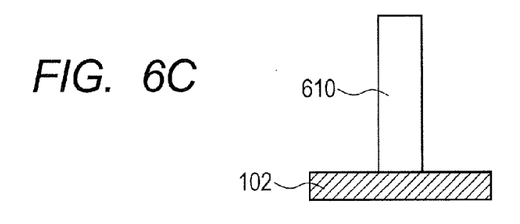

After that, by removing the resist 602, a crystal growth suppressing columnar mask 610 having the shape of the hole 107 is formed as is illustrated in FIG. 6C.

Figure 6D:
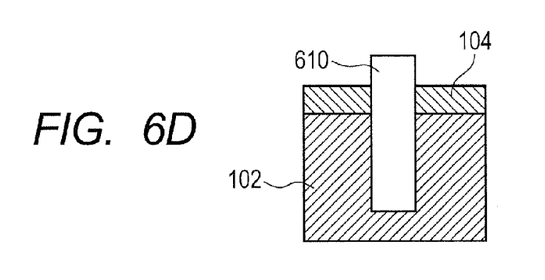

Incidentally, an etching method for the crystal growth suppressing mask 601 may be any one of wet etching and dry etching, but can be the dry etching by ICP, in order to enhance the controllability for the size of the crystal growth suppressing columnar mask 610. Next, as is illustrated in FIG. 6D, the first semiconductor layer 102 and the second semiconductor layer 104 are formed in this order, on the first semiconductor layer 102 on which the crystal growth suppressing columnar mask 610 has been formed so as to have a predetermined thickness that corresponds to the height of the hole 120 from a portion on which the crystal growth suppressing columnar mask 610 is not provided.

Subsequently, the crystal growth suppressing columnar mask 610 is removed.

Figure 6E:
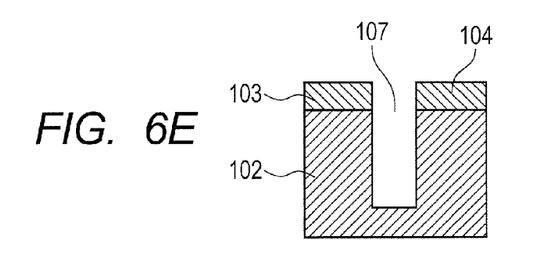

Thereby, a semiconductor structure 100 can be prepared which has the second semiconductor layer 104 provided on the principal plane 103 of the first semiconductor layer 102, and has the hole 107 that penetrates through the second semiconductor layer 104 and is formed in the first semiconductor layer 102, as is illustrated in FIG. 6E.

Here, the silicon oxide can be dry-etched by a lower power than that for GaN.

Because of this, damage by the etching for the silicon oxide to a layer arranged under a layer to be dry-etched becomes smaller than that by the etching for GaN.

Accordingly, in a surface emitting laser in which a photonic crystal layer is formed on an active layer, for instance, the crystal growth suppressing mask can be dry-etched at a lower power and a damage to the active layer can be reduced in the present embodiment, as compared to the case in which the photonic crystal layer is formed by dry-etching an epitaxial layer formed of GaN.

Thus, according to the present embodiment, a hole is formed by crystal growth with the use of a crystal growth suppressing mask which can be dry-etched at a lower power than that for GaN, and thereby a damage by the dry etching to the lower layer of a layer in which the hole is formed can be reduced.

Example

Next, the example of the present invention will be described.

In the present example, a surface emitting laser provided with a two-dimensional photonic crystal having a structure to which the present invention is applied will be described below with reference to FIG. 7.

First Step

The first step in the present example will be described below with reference to FIG. 7A to FIG. 7C.

Firstly, a process of a crystal growth of a nitride semiconductor layer, which is contained in the first step in the present example, will be described below with reference to FIG. 7A.

Figure 7A:
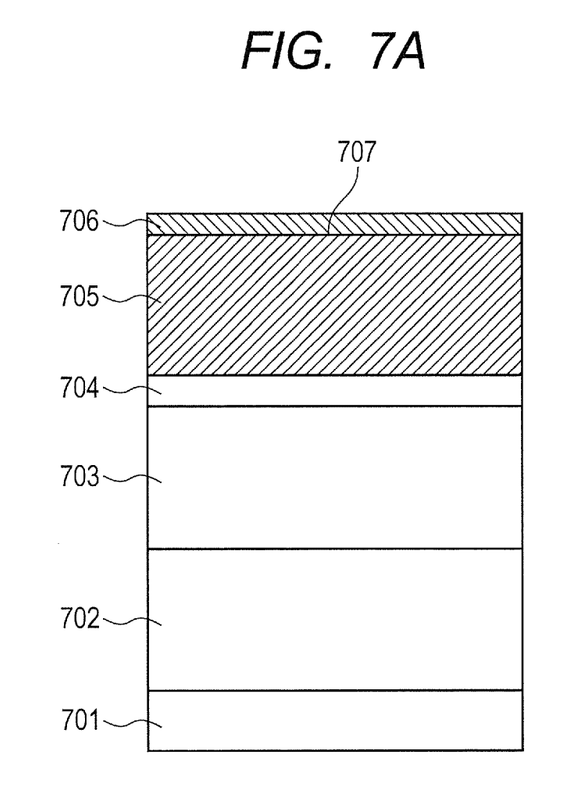
FIGS. 7A, 7B, 7C, 7D, 7E and 7F are cross-sectional views for describing an example of the production process in Example 1.

As illustrated in FIG. 7A, each of the layers as mentioned below is grown on a GaN substrate 701 in the following order with an MOVPE method.

Specifically, n-type $Al_{0.09}Ga_{0.91}N$ which is an n-type cladding layer 702, n-type GaN which is an n-type guide layer 703, an active layer 704, p-type GaN which is a p-type guide layer 705 and p-type $Al_{0.1}Ga_{0.9}N$ which is a mass transport suppressing layer 706 are grown in this order. Here, the p-type guide layer 705 corresponds to the first semiconductor layer 102 which has been described in the Embodiment 1, and a principal plane 707 thereof is the (0001) plane. In addition, the mass transport suppressing layer 706 corresponds to the second semiconductor layer 104 which has been described in the Embodiment 1.

In addition, the film thickness of the p-type $Al_{0.1}Ga_{0.9}N$ is 100 nm.

Furthermore, the growing temperature T1 of the p-type GaN is 1,100° C. and the growing temperature T2 of the p-type $Al_{0.1}Ga_{0.9}N$ is 1,150° C.

The active layer 704 forms a multiple quantum-well structure of three periods. As for the material, the well layer is made of $In_{0.09}Ga_{0.91}N$ and the barrier layer is made of GaN.

The second semiconductor layer in the present example is not particularly limited to the above described p-type $Al_{0.1}Ga_{0.9}N$ with the thickness of 100 nm, but may have another Al composition or different film thickness, as long as the semiconductor layer having the composition or the film thickness functions as a mask which suppresses mass transport.

Here, when the crystal of AlGaN is grown on GaN, there is a high possibility that when the Al composition increases, cracks are generated in the crystals due to the influence of lattice distortion, which exerts an adverse effect on characteristics of the surface emitting laser.

Similarly, when the thickness of AlGaN is increased, there is a high possibility that the cracks are generated in the crystals due to the influence of the lattice distortion, which exerts the adverse effect on the characteristics of the surface emitting laser.

In addition, the p-type AlGaN in the present example functions also as a p-type conduction layer, but when the Al composition increases, electrical conduction characteristics may be deteriorated.

On the other hand, as described above, AlGaN has a lower refractive index compared to that of GaN, and accordingly, the surface emitting laser in the present example can suppress optical absorption in a p-type electrode and increase light confinement into the active layer.

Accordingly, in the case of the p-type $Al_{0.1}Ga_{0.9}N$ in the present example, the film thickness is favorably 160 nm or less.

Next, a process of forming an etching mask, which is contained in the first step in the present example, will be described below.

Figure 7B:
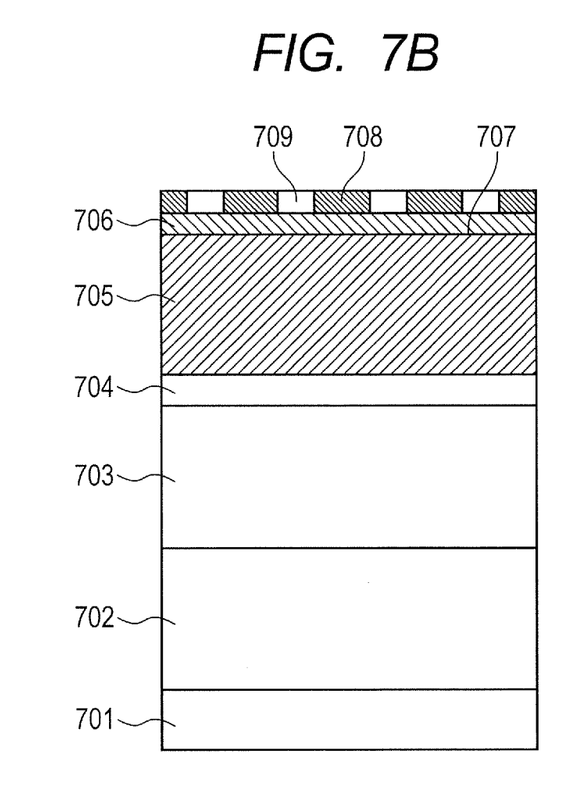

FIG. 7B is a view for describing the process of forming the etching mask 708 for forming a two-dimensional photonic crystal having a hole penetrating through the p-type $Al_{0.1}Ga_{0.9}N$ that is the mass transport suppressing layer 706, in the p-type $Al_{0.1}Ga_{0.9}$ and the p-type GaN that is the guide layer 705.

The process of FIG. 7B will be sequentially described below.

Firstly, an SiOx film is formed on the mass transport suppressing layer 706 by plasma CVD so as to have a thickness of 150 nm.

Subsequently, a two-dimensional photonic-crystal pattern which includes a plurality of openings 709 is formed on the SiOx film with electron-beam lithography and ICP etching.

The openings 709 have a hole diameter of 60 nm and are arranged in a tetragonal lattice shape with a period of 160 nm in an in-plane direction.

Next, a process of forming the two-dimensional photonic crystal, which is contained in the first step of the present example, will be described below.

Figure 7C:
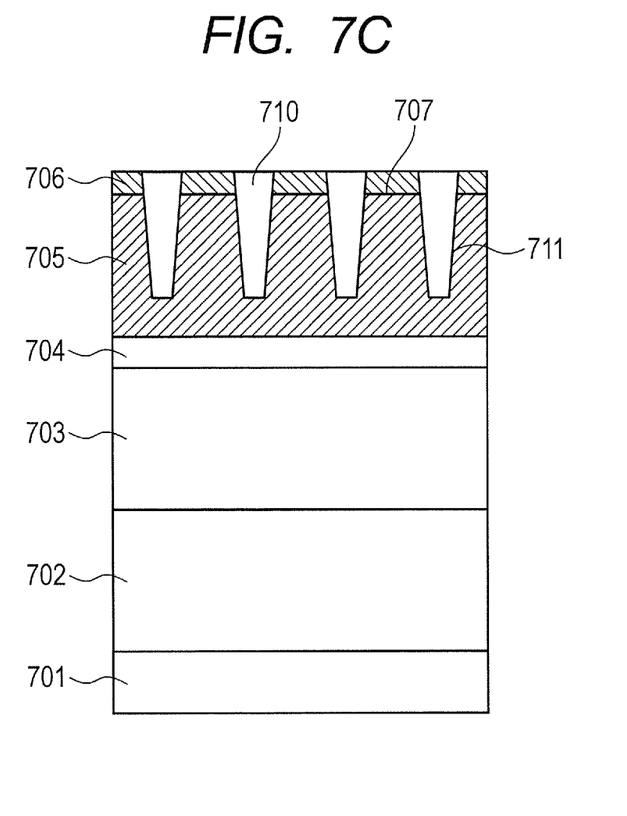

FIG. 7C is a view for describing the processes of etching the p-type guide layer 705 by penetrating through the mass transport suppressing layer 706 by using the etching mask 708 (SiOx film) to form a two-dimensional photonic crystal formed of a plurality of holes 710, and then removing the etching mask 708, which follow the process of FIG. 7B.

The two-dimensional photonic crystal is formed by using dry etching with ICP.

The gas composition for ICP is a mixed gas plasma of $Cl_2$ and Ar. The depth of the hole 710 of the two-dimensional photonic crystal after having been etched is 100 nm.

Second Step

Next, the second step of the present example will be described below.

Figure 7D:
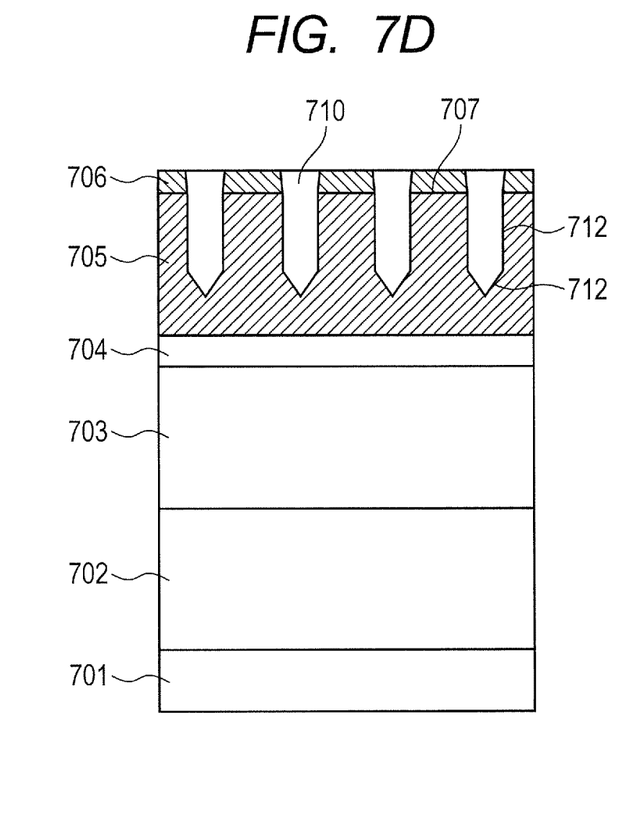

FIG. 7D is a view for describing the second step which follows the process of FIG. 7C.

Specifically, in the second step, the substrate is subjected to heat treatment under a gas atmosphere including an element of nitrogen which is of the group V, and the mass transport is generated in the p-type GaN which is the p-type guide layer 705, by using the mass transport suppressing layer 706 as a mask.

Then, a crystal plane 712 of the p-type GaN which is the material of the p-type guide layer 705 is formed on the side wall 711 of the hole 710 which constitutes the two-dimensional photonic crystal.

As for the gas atmosphere of the second step, the flow rate of $N_2$ is 10 slm (standard litter per minute), the flow rate of $NH_3$ is 5 slm, and the heat treatment temperature T3 is 1,025° C.

The flow rate of 10 slm of $N_2$ corresponds to 0.45 mol/min, and the flow rate of 5 slm of $NH_3$ corresponds to 0.22 mol/min.

In addition, in the second step of the present example, $CP_2Mg$ which is a raw material of a p-type dopant is not supplied, but $CP_2Mg$ may be supplied when the heat treatment process is intended to be optimized. Because the principal plane 707 of the p-type GaN which is the p-type guide layer 705 is the (0001) plane, a (1-100) plane perpendicular to the principal plane 707 and an inclined (1-103) plane are formed on the side wall 711, by mass transport.

Here, as described above, the purpose of the second step is to form the crystal plane 712 of the p-type GaN which is the material of the p-type guide layer 705, on the side wall 711 of the hole 710 that has been formed in the p-type GaN which is the p-type guide layer 705.

For this reason, in order that such considerable mass transport as is described in Japanese Patent Application Laid-Open No. 2004-111766 does not occur, the heat treatment temperature T3 is set at 1,025° C. so that the relationship among the growing temperature T1 of the first semiconductor layer, the growing temperature T2 of the second semiconductor layer and the heat treatment temperature T3 satisfies the relations of T3≤T1,T2, and the retention time is set at four minutes.

Third Step

Next, the third step in the present example will be described below.

Figure 7E:
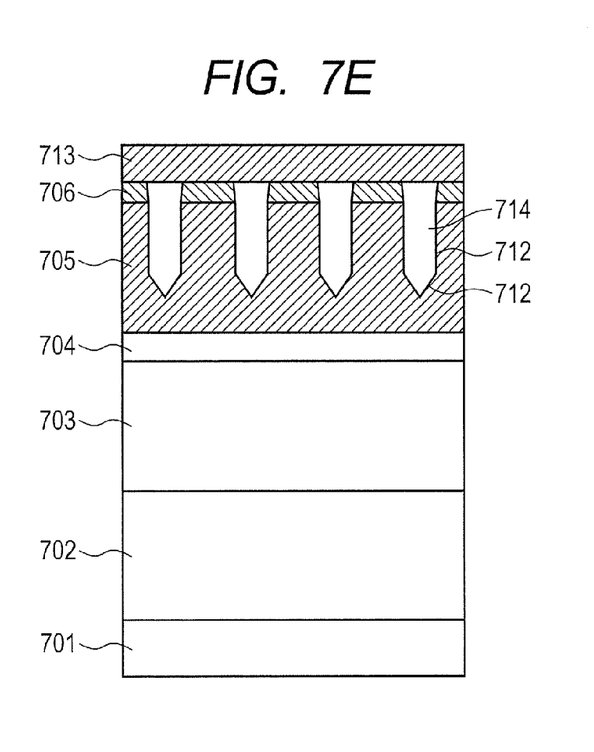

FIG. 7E is a view for describing the third step which follows the process of FIG. 7D.

Specifically, in the third step, the upper part of the hole 710 of the two-dimensional photonic crystal is covered with a cap layer 713 of p-type GaN by the crystal growth, and the two-dimensional photonic crystal is embedded inside the p-type GaN layer and the p-type $Al_{0.1}Ga_{0.9}N$.

In the present example, the cap layer 713 corresponds to the third semiconductor layer 111 shown in the embodiment 1.

As a result of the third step, the upper part of the two-dimensional photonic crystal was covered with the cap layer 713 and a hole 714 could be formed, almost without varying the hole size (distance between opposing side wall surfaces) of the hole 710 of the two-dimensional photonic crystal.

Figure 7F:
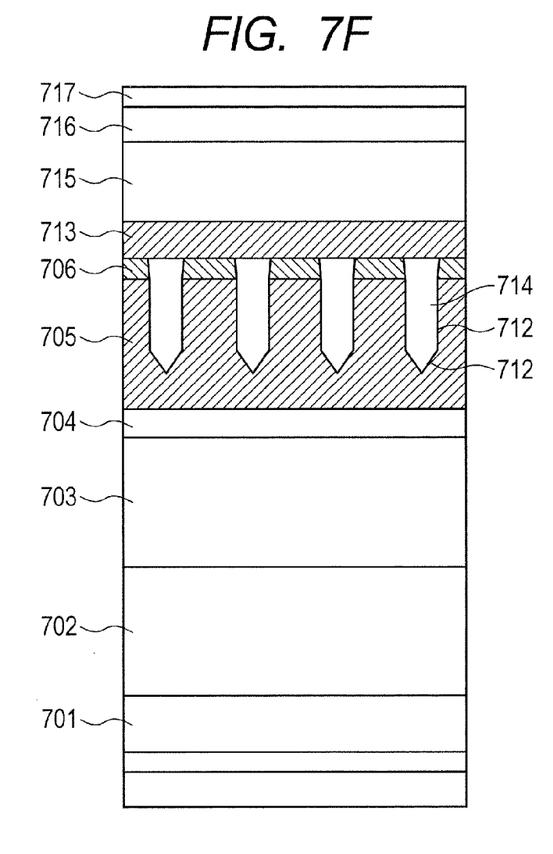

Next, as is illustrated in FIG. 7F, p-type $Al_{0.1}Ga_{0.9}N$ which is a p-type cladding layer 715, and p-type GaN which is a p-type contact layer 716 are sequentially grown on the cap layer 713 (p-type GaN) with an MOVPE method.

Next, an n-type electrode of Ti/Al is formed on the back of the GaN substrate 701 and a p-type electrode 717 of Ti/Au is formed on the surface of the p-type contact layer, with photolithography, an electron beam evaporation method and a lift-off method.

By the above described processes, a surface emitting laser having a two-dimensional photonic crystal can be produced, which operates in a wavelength band of 400 nm.

While the present invention has been described with reference to examples, it is to be understood that the invention is not limited to the disclosed examples. The scope of the following claims is to be accorded the broadest interpretation so as to encompass all such modifications and equivalent structures and functions.

What is claimed is:

1. A process for forming a microstructure of a nitride semiconductor comprising:
   (1) preparing a semiconductor structure having a first layer and a second layer formed on a principal plane of the first layer, a hole being formed in the first layer and penetrating through the second layer, the first layer comprising a nitride semiconductor containing no Al, the second layer comprising a nitride semiconductor containing at least Al;
   (2) subjecting the semiconductor structure to heat treatment under a gas atmosphere including a nitrogen element after step (1) to form a crystal plane of the nitride semiconductor, on at least a part of a side wall of the hole; and
   (3) forming a third semiconductor layer comprising a nitride semiconductor on the second semiconductor layer after step (2) to cover the upper part of the hole.

2. The process for forming a microstructure of a nitride semiconductor according to claim 1, wherein when a temperature at the time when the first layer is formed is defined as T1, a temperature at the time when the second layer is formed is defined as T2 and a temperature of the heat treatment in step (2) is defined as T3, the relation among these temperatures satisfies T3≤T1, and T3≤T2.

3. The process for forming a microstructure of a nitride semiconductor according to claim 1, wherein step (1) comprises:
   (1-1) forming the second layer on the principal plane of the first layer; and
   (1-2) forming the hole that penetrates through the second layer and is formed in the first layer by etching.

4. The process for forming a microstructure of a nitride semiconductor according to claim 3, wherein, in step (1-2), an etching mask is used which has at least such one side of a top surface shape of an opening of the hole as to be parallel to the crystal plane.

5. The process for forming a microstructure of a nitride semiconductor according to claim 1, wherein step (1) comprises:
   (1-1) forming a crystal growth suppressing mask with a shape of the hole, which is a mask for suppressing a crystal growth of the first layer and the second layer, on a first plane of the first semiconductor layer;

(1-2) laminating the same layer as the first layer, in a region on the first plane of the first layer where the crystal growth suppressing mask is not formed;

(1-3) laminating the second layer on the first layer in the region on the first plane of the first layer where the crystal growth suppressing mask is not formed; and (1-4) removing the crystal growth suppressing mask, after laminating the second layer.

6. The process for forming a microstructure of a nitride semiconductor according to claim 1, wherein a distance between opposing side wall surfaces of the hole is 1 µm or less.

7. The process for forming a microstructure of a nitride semiconductor according to claim 1, wherein the nitride semiconductor is a photonic crystal having a plurality of the holes.

8. A process for producing a surface emitting laser using a two-dimensional photonic crystal, comprising using the photonic crystal that is formed by the process for forming a microstructure of a nitride semiconductor according to claim 7.

9. A surface emitting laser comprising:
an active layer; and
a photonic crystal layer,
wherein the photonic crystal layer comprises a first layer comprising a nitride semiconductor containing no Al and a second layer comprising a nitride semiconductor containing at least Al, the first layer being arranged closer to the active layer than the second layer, and a hole being formed in the first layer and penetrating through the second layer, and wherein a crystal plane is formed on at least a part of a side wall of the hole.

10. The surface emitting laser according to claim 9, wherein the first layer comprises GaN and the second layer comprises AlGaN.

11. The surface emitting laser according to claim 10, wherein the AlGaN has an Al composition of 10%, and the AlGaN has a thickness of 160 nm or less.

12. The process for forming a microstructure of a nitride semiconductor according to claim 1, wherein the first layer comprises at least one of GaN, GaInN and InN.

13. The process for forming a microstructure of a nitride semiconductor according to claim 1, wherein the second layer comprises at least one of AlN, AlInN, AlGaInN and AlGaN.

14. The process for forming a microstructure of a nitride semiconductor according to claim 1, wherein the third layer comprises at least one of GaN, GaInN, InN, AlN, AlGaN, AlInN and AlGaInN.

15. The surface emitting laser according to claim 9, wherein the first layer comprises at least one of GaN, GaInN and InN.

16. The surface emitting laser according to claim 9, wherein the second layer comprises at least one of AlN, AlInN, AlGaInN and AlGaN.

* * * * *